United States Patent
Kerr (10) Patent No.: US 10,629,533 B2
(45) Date of Patent: Apr. 21, 2020

(54) POWER ISLAND SEGMENTATION FOR SELECTIVE BOND-OUT

(71) Applicant: Toshiba Memory Corporation, Minato-ku, Tokyo (JP)

(72) Inventor: Benjamin Kerr, Northampton (GB)

(73) Assignee: Toshiba Memory Corporation, Tokyo (JP)

(*) Notice: Subject to any disclaimer, the term of this patent is extended or adjusted under 35 U.S.C. 154(b) by 0 days.

(21) Appl. No.: 15/920,002

(22) Filed: Mar. 13, 2018

(65) Prior Publication Data
US 2019/0287906 A1    Sep. 19, 2019

(51) Int. Cl.
| | | |
|---|---|---|
| H01L 29/40 | (2006.01) | |
| H01L 23/52 | (2006.01) | |
| H01L 23/48 | (2006.01) | |
| H01L 23/528 | (2006.01) | |
| H01L 23/49 | (2006.01) | |

(Continued)

(52) U.S. Cl.
CPC .......... *H01L 23/5286* (2013.01); *H01L 23/49* (2013.01); *H01L 23/49816* (2013.01); *H01L 23/49838* (2013.01); *H01L 24/06* (2013.01); *H01L 2224/06131* (2013.01); *H01L 2224/06132* (2013.01); *H01L 2224/06134* (2013.01); *H01L 2224/06164* (2013.01); *H01L 2224/06177* (2013.01)

(58) Field of Classification Search
CPC .......... H01L 23/5286; H01L 23/49838; H01L 24/06; H01L 23/49816; H01L 23/49; H01L 2224/06134; H01L 2224/06132; H01L 2224/06131; H01L 2224/06177; H01L 2224/06164
See application file for complete search history.

(56) References Cited

U.S. PATENT DOCUMENTS

| | | |
|---|---|---|
| 6,455,336 B1 | 9/2002 | Berndlmaier et al. |
| 6,480,989 B2 | 11/2002 | Chan et al. |

(Continued)

FOREIGN PATENT DOCUMENTS

| | | |
|---|---|---|
| EP | 2293330 A1 | 3/2011 |
| WO | 2010/026956 A1 | 3/2010 |
| WO | 2010/140141 A1 | 12/2010 |

OTHER PUBLICATIONS

International Search Report and Written Opinion dated Aug. 5, 2019 in corresponding PCT/IB2019/000225.

*Primary Examiner* — Ismail A Muse
(74) *Attorney, Agent, or Firm* — White & Case LLP (57) ABSTRACT

A semiconductor chip includes a semiconductor die formed on a substrate, a first power mesh formed on the substrate, and a second power mesh formed on the substrate electrically isolated from the first power mesh. The semiconductor chip also includes a first circuit block formed on the substrate and electrically connected to the first power mesh, and a second circuit block formed on the substrate and electrically connected to the second power mesh. The first circuit block and the second circuit block are communicatively coupled to a first plurality of external circuit connections and a second plurality of external circuit connections, respectively. The semiconductor chip also includes one or more first signal pins and one or more second signal pins formed on the substrate, the first and second signal pins designed to receive external signals.

14 Claims, 8 Drawing Sheets

(51) Int. Cl.
*H01L 23/498* (2006.01)
*H01L 23/00* (2006.01)

(56) References Cited

U.S. PATENT DOCUMENTS

| | | |
|---|---|---|
| 6,493,859 B1 | 12/2002 | Gould et al. |
| 6,523,150 B1 | 2/2003 | Buffet et al. |
| 6,525,983 B2 | 2/2003 | Wilkins |
| 6,657,291 B1 | 12/2003 | Magerlein et al. |
| 6,770,963 B1 | 8/2004 | Wu |
| 7,051,306 B2 | 5/2006 | Hoberman et al. |
| 7,085,152 B2 | 8/2006 | Ellis et al. |
| 7,275,164 B2 | 9/2007 | Hottelet et al. |
| 8,004,922 B2 | 8/2011 | Evoy et al. |
| 8,006,218 B2 | 8/2011 | Chuang |
| 8,097,954 B2* | 1/2012 | Ozawa ............ H01L 23/50 257/686 |
| 8,099,691 B1 | 1/2012 | Tuan et al. |
| 9,411,390 B2 | 8/2016 | Smith et al. |
| 9,423,846 B2 | 8/2016 | Smith et al. |
| 9,935,052 B1* | 4/2018 | Liu ............ H01L 24/14 |
| 2002/0013931 A1* | 1/2002 | Cano ............ G06F 17/5068 716/111 |
| 2003/0219925 A1* | 11/2003 | Chang ............ H01L 23/49838 438/106 |
| 2005/0232053 A1* | 10/2005 | Azuma ............ G11C 5/147 365/226 |
| 2007/0007642 A1* | 1/2007 | Tajika ............ H01L 23/5286 257/691 |
| 2007/0162446 A1* | 7/2007 | Appenzeller ....... G06F 11/2236 |
| 2009/0276644 A1* | 11/2009 | Goodnow ............ G06F 1/26 713/310 |
| 2010/0218158 A1* | 8/2010 | Chow ............ G06F 17/5045 716/116 |
| 2010/0289111 A1* | 11/2010 | Lee ............ G06F 17/5072 257/499 |
| 2011/0001249 A1 | 1/2011 | Law et al. |
| 2011/0068826 A1* | 3/2011 | Azuma ............ G11C 5/147 326/62 |
| 2011/0177658 A1* | 7/2011 | Law ............ H01L 27/0207 438/129 |
| 2011/0199126 A1* | 8/2011 | Onda ............ H01L 27/0207 327/80 |
| 2012/0104596 A1 | 5/2012 | Shah |
| 2012/0295539 A1* | 11/2012 | McCormack ........ H04B 5/0031 455/39 |
| 2013/0002337 A1 | 1/2013 | Oyama |
| 2013/0100590 A1* | 4/2013 | Doman ............ H01L 23/5286 361/679.01 |
| 2013/0183903 A1* | 7/2013 | McCormack ............ H04B 1/40 455/41.2 |
| 2013/0257670 A1* | 10/2013 | Sovero ............ H01Q 1/24 343/833 |
| 2013/0290785 A1* | 10/2013 | Truong ............ G06F 11/3656 714/30 |
| 2014/0111242 A1* | 4/2014 | Xie ............ G01R 31/2853 324/762.02 |
| 2014/0148961 A1* | 5/2014 | Bose ............ G06F 1/26 700/286 |
| 2014/0264814 A1* | 9/2014 | Ossimitz ............ G11C 5/06 257/698 |
| 2015/0355704 A1 | 12/2015 | Grimsrud et al. |
| 2016/0181862 A1* | 6/2016 | Humphrey ............ H02J 9/062 307/64 |
| 2017/0012466 A1* | 1/2017 | Shiotani ............ H03K 19/0016 |
| 2017/0062474 A1* | 3/2017 | Lee ............ H01L 27/11807 |
| 2017/0093405 A1* | 3/2017 | Wang ............ H03K 19/17772 |
| 2017/0110178 A1* | 4/2017 | Bains ............ G11C 8/12 |
| 2017/0146117 A1* | 5/2017 | Philippart ............ F16H 61/12 |
| 2017/0170081 A1* | 6/2017 | Byun ............ G01R 31/31851 |
| 2017/0222467 A1* | 8/2017 | Jeong ............ H02J 7/025 |
| 2017/0291635 A1* | 10/2017 | Yamasaki ............ H02K 11/30 |
| 2018/0061461 A1* | 3/2018 | Seo ............ G11C 7/08 |
| 2018/0144086 A1* | 5/2018 | Chung ............ G06F 17/505 |
| 2018/0252597 A1* | 9/2018 | Jokinen ............ G01K 15/005 |
| 2019/0064906 A1* | 2/2019 | Popovich ............ G06F 1/26 |
| 2019/0155981 A1* | 5/2019 | Biswas ............ H01L 27/0207 |
| 2019/0179389 A1* | 6/2019 | Frick ............ G06F 1/28 |
| 2019/0199334 A1* | 6/2019 | Chakraborty ............ H03K 5/131 |
| 2019/0206858 A1* | 7/2019 | Lin ............ H01L 29/1095 |
| 2019/0247669 A1* | 8/2019 | Nielsen ............ A61B 5/0031 |
| 2019/0280512 A1* | 9/2019 | Park ............ H02J 7/025 |

* cited by examiner

POWER ISLAND SEGMENTATION FOR SELECTIVE BOND-OUT

FIELD OF THE INVENTION

The present invention generally relates to systems and methods for selectively powering circuit functions of a semiconductor device.

BACKGROUND OF THE INVENTION

Semiconductor chips are often commercially produced having various circuits which may or may not be required in the resultant device. A single silicon die may be used to create multiple chip products, some of which require additional functionalities. As a result, some devices are over provisioned based on their intended end use.

Accordingly, there is an unmet need to design present day semiconductor devices to be more customizable depending on intended end use.

BRIEF DESCRIPTION OF THE INVENTION

In an aspect, a semiconductor chip comprising a semiconductor die formed on a substrate includes a first power mesh formed on the substrate and a second power mesh formed on the substrate electrically isolated from the first power mesh. The semiconductor die also includes a first circuit block formed on the substrate and electrically connected to the first power mesh and the first power mesh is configured to supply power to the first circuit block. The semiconductor die includes a second circuit block formed on the substrate and electrically connected to the second power mesh which is configured to supply power to the second circuit block. A first plurality of external circuit connections communicatively couple to the first circuit block and are communicatively isolated from the second circuit block. A second plurality of external circuit connections communicatively couple to the second circuit block and are communicatively isolated from the first circuit block. One or more first signal pins formed on the substrate are configured to be communicatively coupled to receive first one or more external signals, and one or more second signal pins formed on the substrate are configured to be communicatively coupled to receive second one or more external signals.

In another aspect, a method of producing a semiconductor die formed on a substrate includes forming a first circuit block on the substrate, forming a second circuit block on the substrate, segmenting the semiconductor die into a first power mesh and an electrically isolated second power mesh, the first power mesh being electrically coupled to the first circuit block and configured to supply power to the first circuit block, and the second power mesh electrically connected to the second circuit block and configured to supply power to the second circuit block. The method also includes communicatively coupling a first plurality of external circuit connections to the first circuit block, the first plurality of external circuit connections communicatively isolated from the second circuit block, and communicatively coupling a second plurality of external circuit connections to the second circuit block such that the second plurality of external circuit connections is communicatively isolated from the first circuit block. The method also includes connecting the first power mesh to one or more first signal pins, the one or more first signal pins configured to receive one or more external signals, and connecting the second power mesh to one or more second signal pins, the one or more second signal pins configured to receive one or more external signals.

DETAILED DESCRIPTION OF THE INVENTION

Figure 1A:
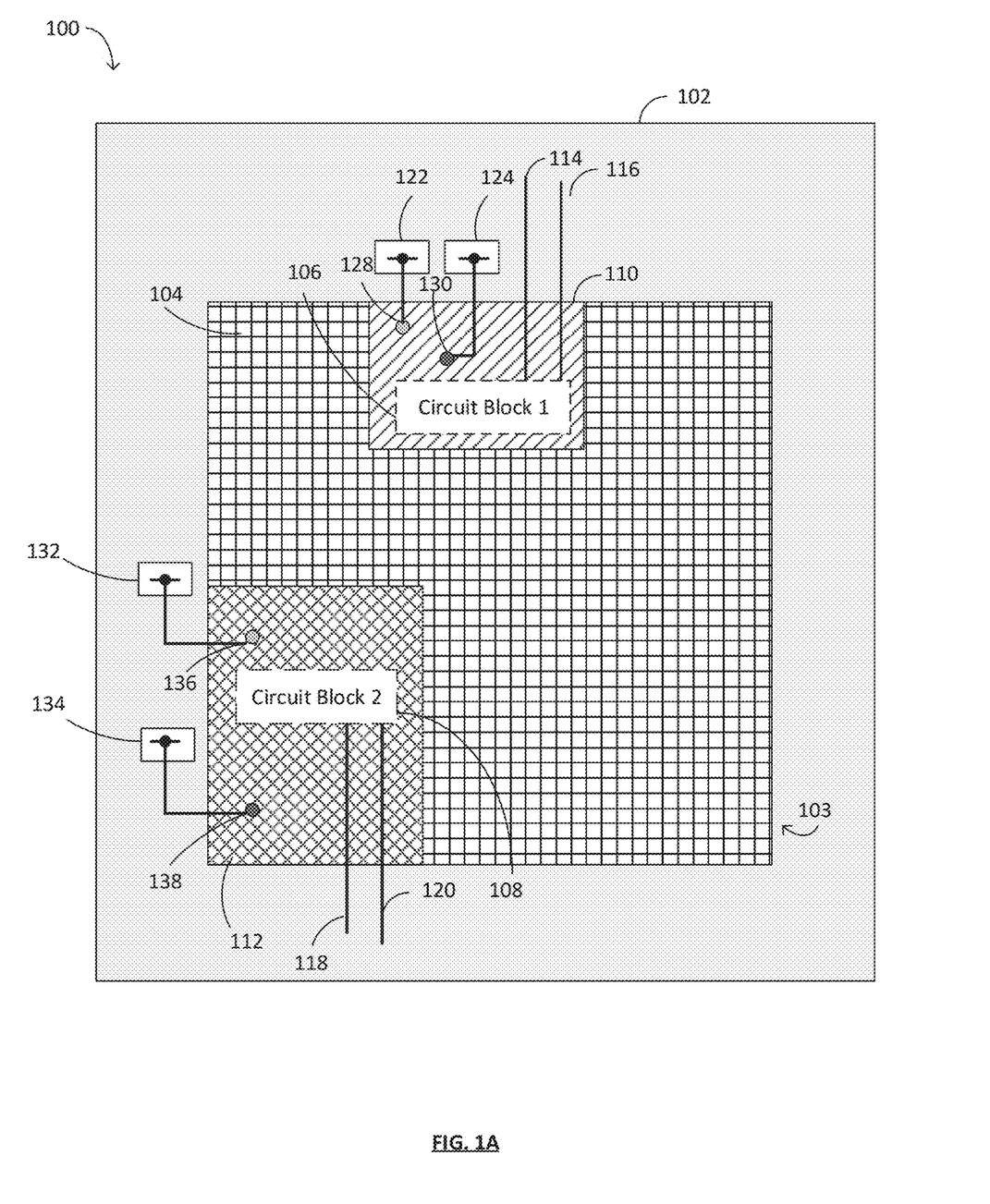
FIG. 1A is a block diagram of a semiconductor device having segmented power meshes to provide power to a first and a second circuit block.

FIG. 1A is a block diagram of a semiconductor device 100 having segmented power meshes to provide power to a first and a second circuit block. The semiconductor device 100 includes a package 102, a semiconductor die 104, a first circuit block 106, a second circuit block 108, a first power mesh 110, and a second power mesh 112. A substrate 103 forms the base of the semiconductor die 104, and the semiconductor die 104 can be bonded to a package 102 to form the semiconductor device 100. A portion of the circuitry of the semiconductor die 104 on the substrate 103 forms the first circuit block 106. The first circuit block 106 communicatively couples to a first external circuit connection 114 and a second external circuit connection 116, such as input/output signals or buses, where the signal or bus may be analogue or digital. Examples of an analogue signal or bus include DC voltages, audio, ultrasonic, or Radio Frequency (RF) inputs and outputs. Examples of a digital data signal or bus include a logic signal, a serial data bus like USB, SATA, and PCIe or a parallel data bus, such as a DRAM or a NAND flash memory channel. The first external circuit connection 114 and the second external circuit connection 116 are communicatively isolated from the second circuit block 108. The first power mesh 110 formed on the semiconductor die 104 electrically connects to the first circuit block 106. The first power mesh 110 includes a first signal pin 128 and a second signal pin 130. The first signal pin 128 couples to a first external terminal 122 located on the package 102, and the second signal pin couples to a second external terminal 124 located on the package 102. Although the first power mesh 110 is shown as coupled to only two external terminals by two signal pins for clarity, any number of terminals and signal pins may be used.

Figure 1B:
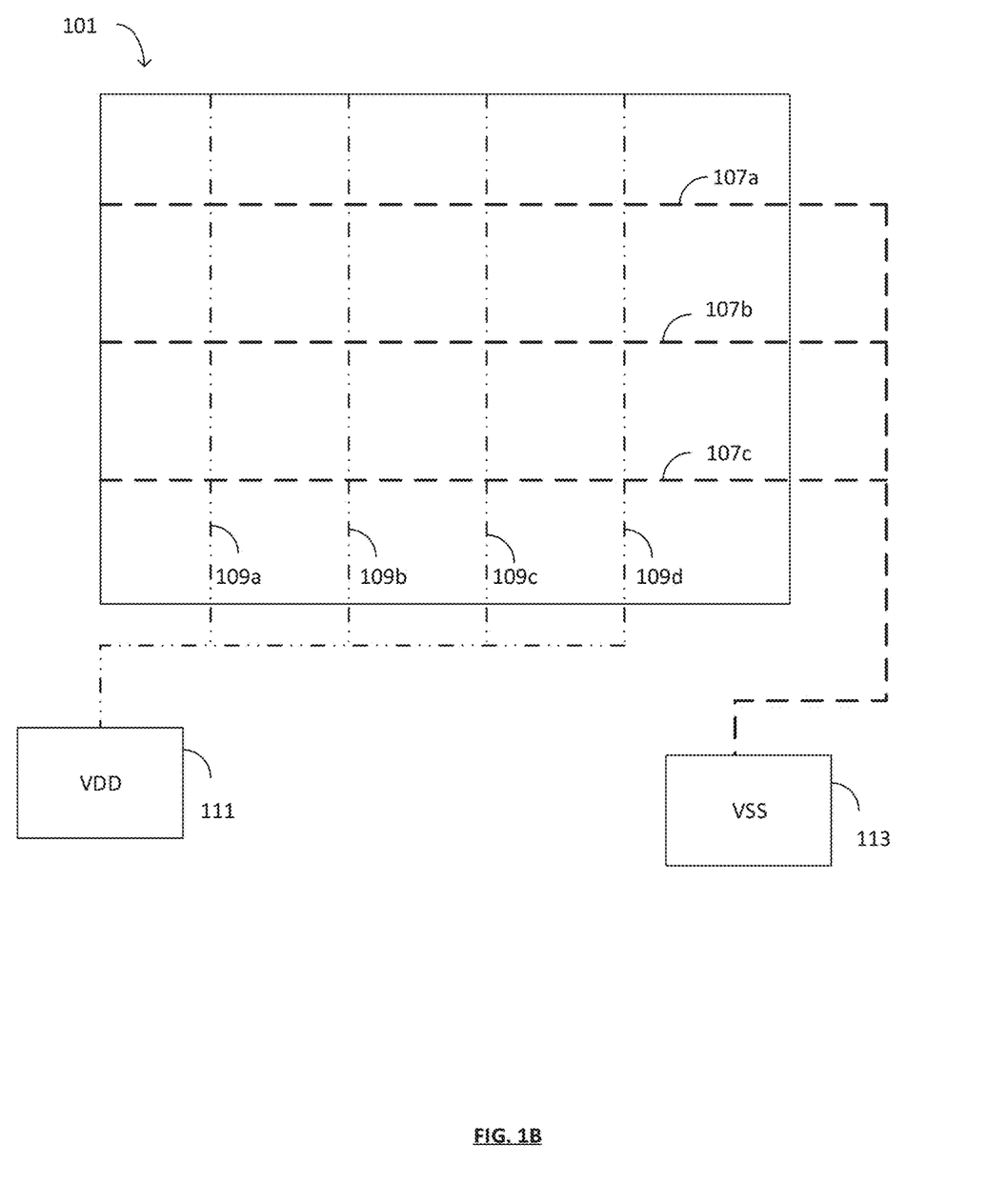
FIG. 1B is a block diagram of a power mesh.

FIG. 1B further illustrates the configuration of a power mesh 101, which may be for example first power mesh 110 or second power mesh 112 of FIG. 1A, or any other power mesh. First power mesh 110 is formed in multiple layers of the semiconductor die 104. A first plurality of connections 107a, 107b, and 107c formed in one or more layers couple to ground 113 (VSS). A second plurality of connections 109*a*, 109*b*, 109*c*, 109*d* formed in one or more layers couple to a power source 111 (VDD), where the first plurality of connections 107*a*, 107*b*, and 107*c* and the second plurality of connections 109*a*, 109*b*, 109*c*, 109*d* are formed in different layers. The first plurality of connections 107*a*, 107*b*, and 107*c* and the second plurality of connections 109*a*, 109*b*, 109*c*, 109*d* are formed in layers which are separated by an insulation layer. The first plurality of connections 107*a*, 107*b*, and 107*c* and the second plurality of connections 109*a*, 109*b*, 109*c*, 109*d* may be coupled to ground and power, respectively. The various layers including wires connected to either ground or power form the first power mesh 110. The layers of wires may be coupled to external power or ground sources through signal pins or package balls. In embodiments using signal pins, the layers of the power mesh are connected to power or ground signals during bond-out. In embodiments in which a ball grid array is used, the layers of the power mesh are connected to power or ground signals by package balls located on the flip chip package itself.

Another portion of the circuitry of the semiconductor die 104 forms the second circuit block 108, which communicatively couples to a third external circuit connection 118 and a fourth external circuit connection 120. The third external circuit connection 118 and the fourth external circuit connection 120 are communicatively isolated from the first circuit block 106. The second power mesh 112 formed on the semiconductor die 104 electrically connects to the second circuit block 108. The second power mesh 112 includes a third signal pin 132, and a fourth signal pin 134, which couple to a third external terminal 132 and a fourth external terminal 134, respectively. Although the second power mesh 112 is shown as coupled to only two external terminals by two signal pins for clarity, any number of terminals and signal pins may be used. The first power mesh 110 remains electrically separate from the second power mesh 112.

The first circuit block 106 and the second circuit block 108 may serve different functions or may be directed to the same or a similar function. For example, in some embodiments, the first circuit block 106 and the second circuit block 108 may be controllers coupled by the first external circuit connection 114, the second external circuit connection 116, the third external circuit connection 118, and the fourth external circuit connection 120 to a plurality of external circuits or devices (not shown). Although each of the first circuit block 106 and the second circuit block 108 are shown having two connected external circuit connections, the first circuit block 106 and the second circuit block 108 may be coupled to any number of external circuit connections, e.g., 16 external circuit connection for coupling to external circuits or devices. In one embodiment, each of the first circuit block 106 and the second circuit block 108 communicatively couples to eight external circuit connections.

Though the first power mesh 110 and the second power mesh 112 are illustrated as overlaying the first circuit block 106 and second circuit block 108 in the semiconductor die 104, respectively, this need not be the case. The first power mesh 110 is associated with the first circuit block 106, but need not be geometrically matched to the first circuit block 106, or positioned in any particular relation to the first circuit block 106 in the vertical or horizontal plane of the semiconductor die 104. The same is true of the second power mesh 112 and the second circuit block 108.

Providing separate power meshes to power the first circuit block 106 and the second circuit block 108, rather than a single power mesh across the entire semiconductor die 104 enables the first circuit block 106 or second circuit block 108 to be left non-operational by not providing power to the first power mesh 110 or second power mesh 112, respectively.

In some implementations of the semiconductor device 100, both the first circuit block 106 and the second circuit block 108 receive power. The first circuit block 106 may be powered from the first power mesh 110 connected to first external terminal 122 by first signal pin 128, and may be grounded from the first power mesh 110 connected to the second external terminal 124 by second signal pin 130. As shown in FIG. 1B, the first power mesh 110 couples to ground and power via different layers of connections in the semiconductor die 110. Similarly, the second circuit block 108 may be powered from the second power mesh 112 connected to the third external terminal 132 by third signal pin 136 and may be grounded from the first power mesh 110 connected to the fourth external terminal 134 by the fourth signal pin 138. In this embodiment in which external terminals provide power to both the first circuit block 106 and the second circuit block 108, the first circuit block 106 and the second circuit block 108 may communicate with external circuits or devices via the coupled external circuit connections or perform other actions according to the internal circuitry of the first circuit block 106 and the second circuit block 108.

In other embodiments of the semiconductor device 100, the first circuit block 106, or the second circuit block 108, is configured to be non-operational. The first circuit block 106 receives no power, but instead is grounded from the first power mesh 110 by the first external terminal 122 and the second external terminal 124. Connecting the first signal pin 128 and the second signal pin 130 to ground rather than power prevents the first power mesh 110 from drawing power. In some embodiments, the first power mesh 110 is coupled to ground by one of the first external terminal 122 and the second external terminal 124, and additional signal pins may not be coupled to either of power or ground. The second circuit block 108 may be powered from the second power mesh 112 from the third external terminal 132 coupled to the third signal pin 136 and may be grounded from the fourth external terminal 134 coupled to the fourth signal pin 138. In this embodiment, the third external terminal 132 provides power to the second circuit block 108, allowing communication between the second circuit block 108 and the external circuits or devices (not shown) via the coupled third external circuit connection 118 and fourth external circuit connection 120. However, because the first power mesh 110 and the second power mesh 112 are electrically separate, providing power to the second circuit block 108 does not impact the first circuit block 106. Further, because the power meshes are electrically separate and separately coupled to power or ground sources, the first circuit block 106 experiences no leakage current during the provision of power to the second circuit block 108.

Electrically separating the first power mesh 110 and the second power mesh 112 enables the utilization of a single semiconductor die 104 to create multiple semiconductor dies having varying numbers of enabled circuit blocks. As described above, the circuit blocks may be controllers for a number of external circuits or devices, such that a first device created from a semiconductor die includes a first number coupled to two circuit blocks powered by electrically separate power meshes, and a second device created from the same semiconductor die intended to include a lesser number of external circuits or devices includes one non-operational circuit block which is not powered, as power need not be provided to the circuit block connected to unused external circuit connections. Different products produced by such a method may be functionally different or, as in the example described here, may offer a reduced functionality and corresponding device size.

Using a single silicon die in the production of multiple products is cost-effective and permits each product to be customized for intended end use. Further, not providing power to the unused circuit block reduces the overall power of the device in the reduced functionality mode. Utilizing multiple electrically separate power meshes forming "power islands" instead of a single power mesh with internal power switching cells to remove power to unused circuitry reduces the leakage current which exists in switch-based systems.

Figure 2:
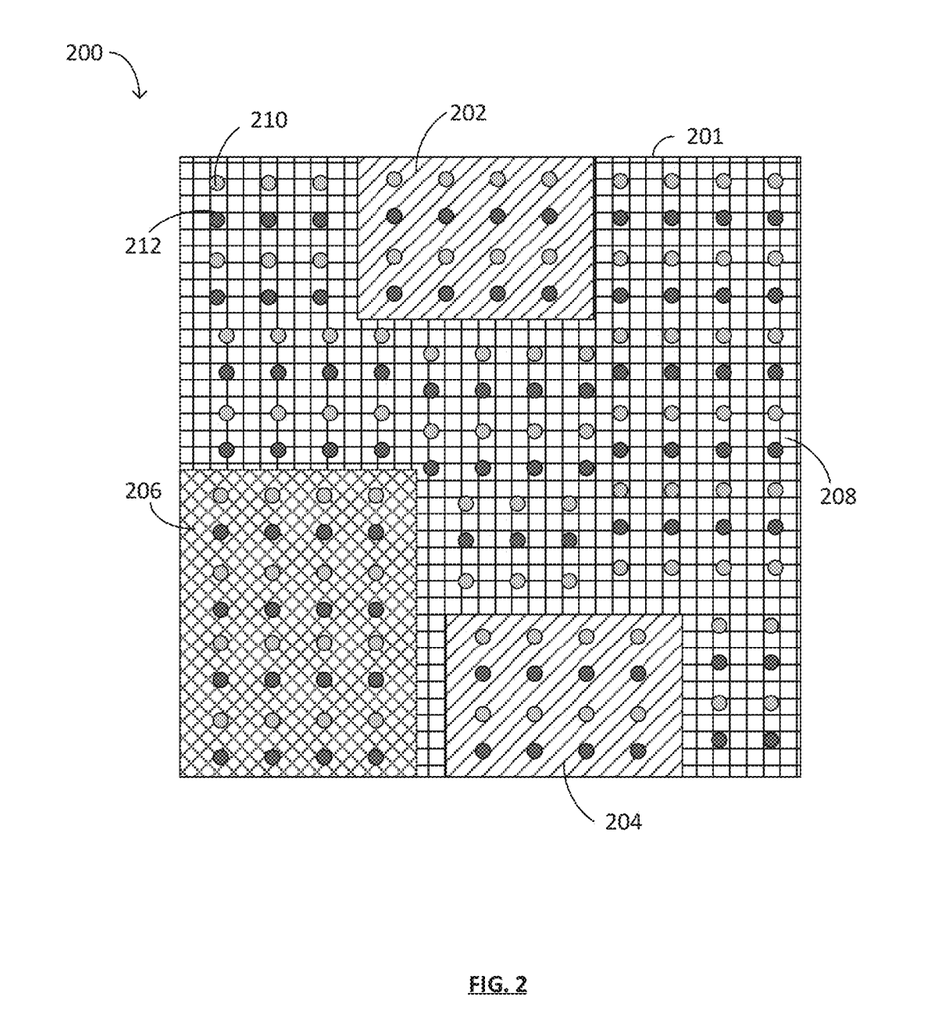
FIG. 2 is a block diagram of a semiconductor die having a segmented power mesh.

FIG. 2 is a block diagram of a semiconductor die 200 having a segmented power mesh, as in FIG. 1A. The semiconductor die 200 includes a main power mesh 208, a first power mesh 202, a second power mesh 204, and a third power mesh 206. The semiconductor die 200 includes a plurality of ground and power signal pins, though only two are labelled for convenience: power pin 210 and ground pin 212. Other signal pins providing ground and power are shown across the semiconductor die 200 as grey and black dots. The ground pins and the power pins would be connected to the power meshes at various layers of the semiconductor die 200 meant to couple to power or ground, as illustrated in FIG. 1B.

The first power mesh 202, second power mesh 204, and third power mesh 206 are electrically separate from the main power mesh 208. First power mesh 202 and second power mesh 204 may be electrically coupled, and may further be electrically separate from the third power mesh 206. The first power mesh 202, second power mesh 204, and third power mesh 206 form "power islands" electrically separate from the main power mesh 208. This enables circuitry and I/O cells coupled to the power meshes to be enabled or disabled depending on the intended end use of the device.

For example, if the circuitry associated with the first power mesh 202 and the second power mesh 204 is not intended to be used in a device, the first power mesh 202 and the second power mesh 204 associated with the unused circuitry can be provided with no power by coupling the first power mesh 202 and the second power mesh 204 only to ground sources. Accordingly, the unused circuitry draws no power.

Power islands created by the first power mesh 202, second power mesh 204, and third power mesh 206 can be connected to power ("VDD") if the associated circuitry needs to be powered for the intended use of the chip. Alternatively, if not all associated circuitry is required for the intended use of the chip, some or all of the first power mesh 202, second power mesh 204, and third power mesh 206 can be connected only to ground ("VSS"). This results in a reduced-functionality version of the semiconductor die 200 in which external terminals provide power to only a subset of the circuitry, thereby saving power.

Directly coupling the electrically separate power meshes to the power or ground sources saves power as compared to a system using switches, because on-die switches used to turn on or off power to a circuit block consume leakage power even when they are turned off. During bond-out or connection of the power meshes to power and ground, the functionality of the device is set for its intended end use. At this point connecting the first power mesh 202, second power mesh 204, and third power mesh 206 to the ground and/or power sources to enable or disable the distribution of power to the associated circuitry sets the functionality of the device.

The first power mesh 202, second power mesh 204, and third power mesh 206 couple to the ground and/or power sources by bonding out from the signal pins in the semiconductor die to external terminals on the package (not shown, see e.g., first and second external terminals 122 and 124, and package 102 in FIG. 1A). Alternatively, in some embodiments using a ball grid array, the first power mesh 202, second power mesh 204, and third power mesh 206 couple to the power and/or ground source by bonding out from the ball pads located on the package. Instead of only selecting the functionality of the device by bonding out specific sections, the use of power islands enables selective disablement of unnecessary circuitry. In this way, individual circuits or features may be turned off or on for different versions of a chip made from a common semiconductor die.

In embodiments in which a flip chip is used as the package, the flip chip package is placed directly onto the semiconductor die without a need for bond wires. The power islands can be used in a flip chip package just as well as in a chip requiring bond out to connect the power mesh to power and ground sources. In an implementation in which a flip chip package is used, access to the face of the die is lost once the chip has been coupled to the flip chip package, preventing any further connections or changes to the semiconductor die.

In one embodiment, in FIG. 2 the first power mesh 202, second power mesh 204, and third power mesh 206, associated with circuit blocks not required for a reduced-functionality version of the chip, are segmented from the main power mesh 208. Each of the first power mesh 202, second power mesh 204, and third power mesh 206 connects to ground (VSS) and receives no power. In another embodiment requiring the circuits associated with the three power meshes, respectively, for the full functionality version of the chip, the circuits associated with the first power mesh 202, second power mesh 204, and third power mesh 206 would need to be powered, and each of the first power mesh 202, second power mesh 204, and third power mesh 206 connects to power (VDD). In such an embodiment, the first power mesh 202, the second power mesh, 204, and the third power mesh 206 connect to one or more different power supplies, or to the same power supply as the circuitry associated with the main power mesh 208 receiving power in both examples.

Figure 3:
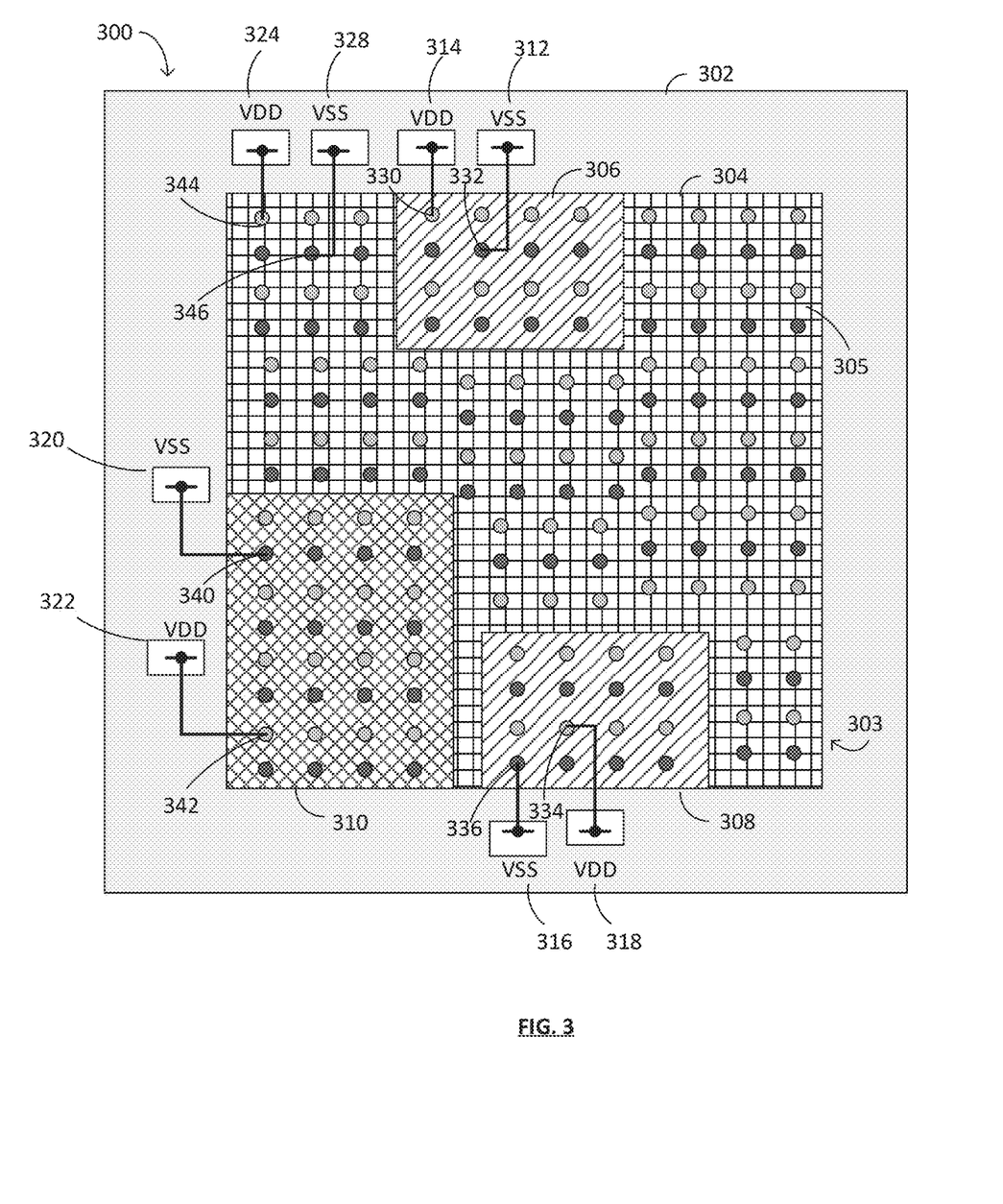
FIG. 3 is a block diagram of a semiconductor device having a segmented power mesh in which all segments are powered.

FIG. 3 is a block diagram of a semiconductor device 300 having a segmented power mesh in which all segments are powered. The semiconductor device 300 includes a package 302 and a semiconductor die 304 formed on a substrate 303, the semiconductor die 304 having a main power mesh 305, a first power mesh 306, a second power mesh 308, and a third power mesh 310. The semiconductor die 304 includes a plurality of signal pins for connecting the power meshes to external power and ground sources.

The semiconductor device includes the semiconductor die 304 bonded to the package 302, the package 302 including a plurality of external terminals designed to be communicatively coupled to signal pins in the semiconductor die 304 to power and ground the power meshes of the semiconductor die. The first power mesh 306 may be powered by a connection from a first signal pin 330 to a first external terminal 314. A connection from a second signal pin 332 to a second external terminal 312 grounds the first power mesh 306. Although only the first signal pin 330 and the second signal pin 332 are depicted as coupled to an external terminal on the package 302, any number of signal pins in the power meshes can be coupled to external terminals.

The second power mesh 308 may be powered by a connection from a third signal pin 334 to a third external terminal 318. A connection from a fourth signal pin 336 to a fourth external terminal 316 grounds the second power mesh 308. The third power mesh 310 may be powered by a connection from a fifth signal pin 342 to a fifth external terminal 322. A connection from a sixth signal pin 340 to a sixth external terminal 320 grounds the third power mesh 310. The main power mesh 305 is powered by a connection from a seventh signal pin 344 to a seventh external terminal 324. A connection from an eighth signal pin 346 to an eighth external terminal 328 grounds the main power mesh 305.

Because each of the main power mesh 305, first power mesh 306, second power mesh 308, and third power mesh 310 is powered and grounded, the circuitry associated with each of these power meshes is powered in the resulting device. In some embodiments each of the main power mesh 305, first power mesh 306, second power mesh 308, and third power mesh 310 couples to the same power source and ground source. In other embodiments, at least one of the main power mesh 305, first power mesh 306, second power mesh 308, and third power mesh 310 couples to one or more different power sources. In such embodiments, because the first power mesh 306, second power mesh 308, and third power mesh 310 are electrically separate from the main power mesh 305, while the main power mesh is powered on, any power meshes connected to different power sources can be powered down at the power source while retaining the ability to receive power to bring the device to a low power state.

Figure 4:
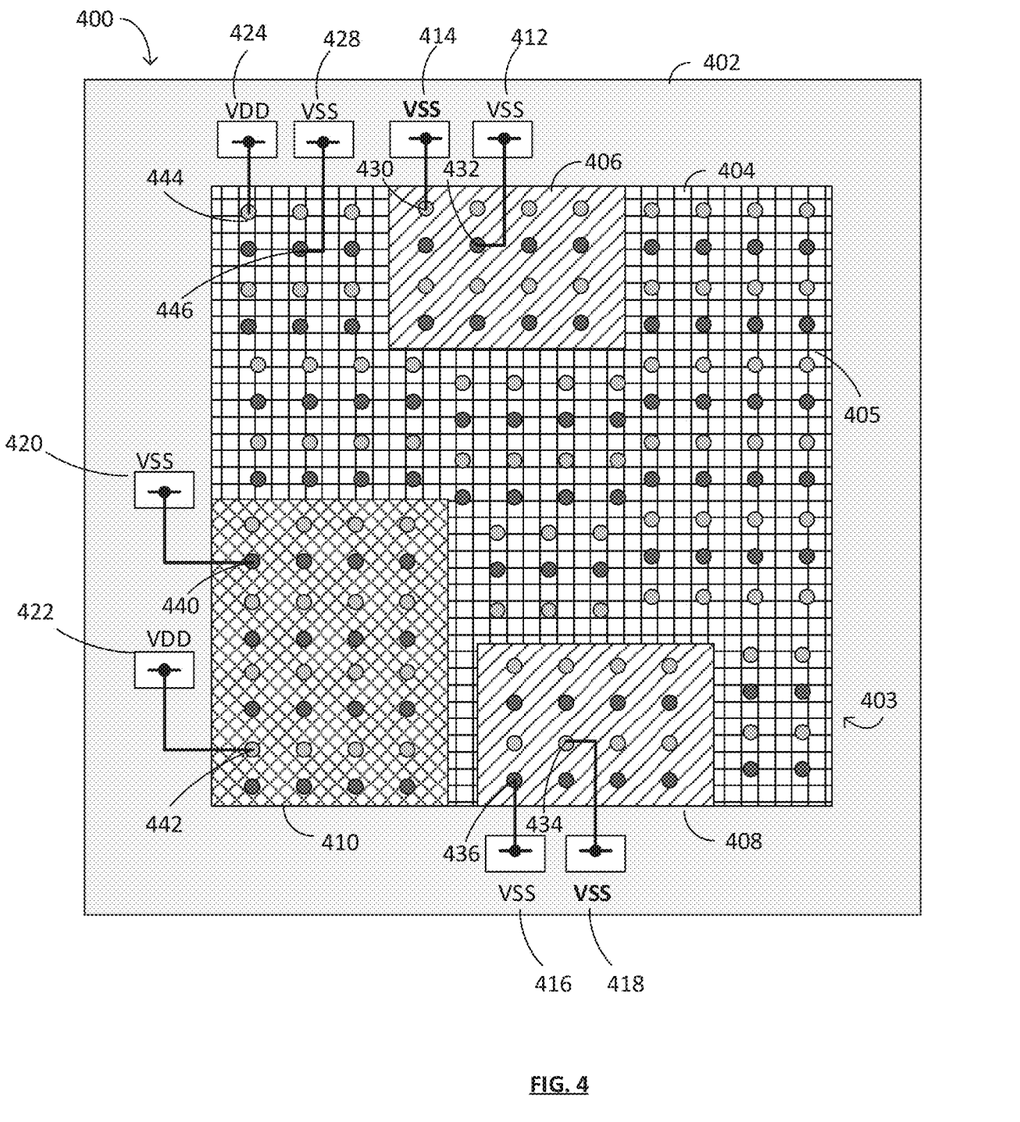
FIG. 4 is a block diagram of a semiconductor device having a segmented power mesh having non-operational circuit blocks associated with one power mesh.

FIG. 4 is a block diagram of a semiconductor device 400 having a segmented power mesh in which one segment is non-operational. The semiconductor device 400 includes a semiconductor die 404 bonded to a package 402. The semiconductor die is formed on a substrate 403, the semiconductor die 404 having a main power mesh 405, a first power mesh 406, a second power mesh 408, and a third power mesh 410. The semiconductor device 400 includes a plurality of signal pins for connecting to external terminals on the package 402 for powering and grounding the power meshes.

The package 402 includes a plurality of external terminals designed to receive an external signal. The first power mesh 406 may be powered by a connection from a first signal pin 430 to a first external terminal 414 and a connection from a second signal pin 432 to a second external terminal 412. The first power mesh 406 does not couple to and is not powered by any power source (VDD). Although only the first signal pin 430 and the second signal pin 432 are depicted as coupled to an external terminal, any number of signal pins in the power meshes can be coupled to external terminals.

The second power mesh 408 couples to a ground source (VSS) by a connection from a third signal pin 434 to a third external terminal 418 and by a connection from a fourth signal pin 436 to a fourth external terminal 416. The second power mesh 408 does not couple to and is not powered by a power source.

The third power mesh 410 is powered by a connection from a fifth signal pin 442 to a fifth external terminal 422 receiving power (VDD). The third power mesh 410 couples to a ground source (VSS) by a connection from a sixth signal pin 440 to a sixth external terminal 420. The main power mesh 405 is powered by a connection from a seventh signal pin 444 to a seventh external terminal 424 receiving power (VDD). The main power mesh 405 couples to a ground source (VSS) by a connection from an eighth signal pin 446 to an eighth external terminal 428.

As is FIG. 3, the main power mesh 405, the first power mesh 406, the second power mesh 408, and the third power mesh 410 form power islands. In this case, the first power mesh 406 and the second power mesh 408 are not powered, and as a result the circuits associated with each of these power meshes will not be functional in the device.

Because the first power mesh 406 and the second power mesh 408 are not communicatively coupled to a power source during bond out, the resulting device is a permanent lower power option compared to the device of FIG. 3 in which all segments could be powered up or down selectively. In this way, the functionality of the device is determined during the bond-out, or the soldering of a flip chip to the semiconductor die. As described above, use of a flip chip package requires no bond-out, but once the flip chip package is coupled to the semiconductor die, access to the face of the semiconductor die is lost. Accordingly, the functionality of the device is determined when the flip chip package is soldered to the semiconductor die. However, the connection of the signal pin or die bumps to the package balls of the flip chip package can still be determined after soldering of the flip chip package to the semiconductor die.

The semiconductor device 400 in which the electrically separate first power mesh 406 and second power mesh 408 are not powered prevents the occurrence of any leakage current during application of power and ground across the third power mesh 410 and main power mesh 405. Because there no connection exists to power from the first power mesh 406 and second power mesh 408, the power consumed by these mesh segments is zero.

In some embodiments, the use of power islands enables the reuse or repackaging of a semiconductor die. Because the circuit blocks associated with the electrically isolated power meshes exists in both a full functionality and reduced functionality version of a device, the circuitry on the semiconductor die is maintained whether the associated power mesh is powered or not. If a die is first packaged for a reduced-functionality end use, it may be repackaged or reused in a full functionality end use version of the device by re-connecting and powering the power meshes associated with the unused circuitry. Because the unused circuit blocks are not physically damaged to prevent power from being provided to the unused circuit blocks, the unused circuit blocks may be powered and utilized in a repackaged device having full functionality.

Additionally, in some embodiments, the use of power islands enables the tolerance of manufacturing faults in the semiconductor die in areas of unused circuitry. A fault in the circuitry associated with a power island to which power will not be supplied can be overlooked or accepted because the circuitry will not be powered or turned on.

Figure 5:
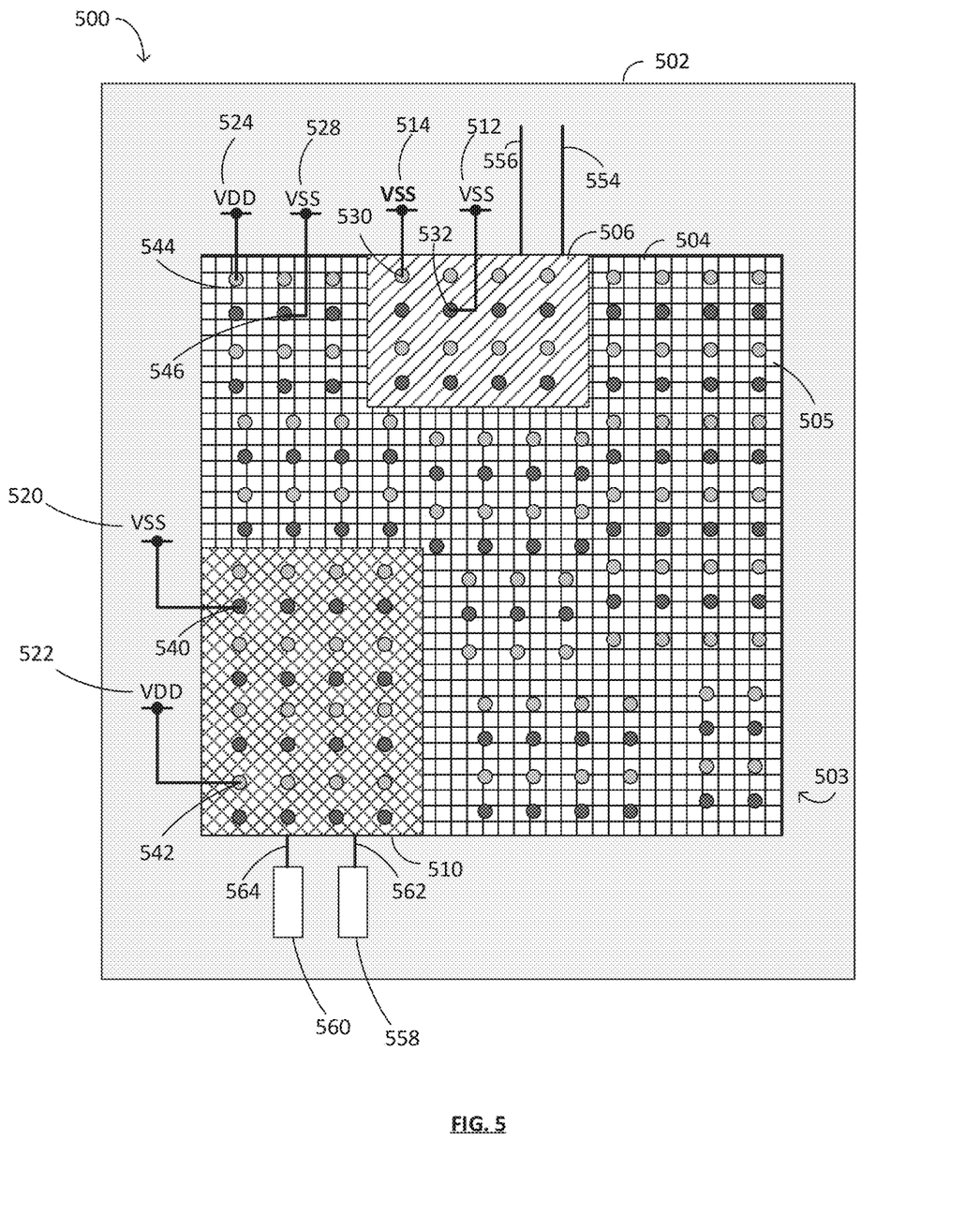
FIG. 5 is a block diagram of a semiconductor device semiconductor having multiple electrically separate power meshes coupled to external circuits or devices.

FIG. 5 is a block diagram of a semiconductor device 500 having multiple electrically separate power meshes coupled to external circuits or devices. The semiconductor device 500 includes a package 502 and a semiconductor die 504 formed on a substrate 503, the semiconductor die 504 having a main power mesh 505, a first power mesh 506, and a second power mesh 510. The semiconductor device 500 includes a plurality of signal pins for connecting to external power and ground sources The package 502 includes a plurality of external terminals which are configured to be communicatively coupled to receive an external signal. The first power mesh 506 couples to a ground source (VSS) by a connection from a first signal pin 530 to a first external terminal 514 and a connection from a second signal pin 532 to a second external terminal 512. The first power mesh 506 does not couple to and receives no power from a power source (VDD). Circuit blocks (not shown) formed in a portion of the circuitry of the semiconductor die associated with the first power mesh 506 communicatively couples to a first external circuit connection 556 and a second external circuit connection 554. The first external circuit connection 556 and the second external circuit connection 554 do not couple to any external circuits or devices. Although only the first signal pin 530 and the second signal pin 532 are depicted as coupled to an external terminal, any number of signal pins in the power meshes can be coupled to external terminals.

The second power mesh 510 is powered by a connection from a third signal pin 542 to a third external terminal 522 receiving power. The second power mesh 510 couples to a ground source (VSS) by a connection from a fourth signal pin 540 to a fourth external terminal 520. Circuits formed in circuitry of the die associated with the second power mesh 510 communicatively couples to a third external circuit connection 562 and a fourth external circuit connection 564. The third external circuit connection 562 communicatively couples to a first external circuit or device 558, and the fourth external circuit connection 564 communicatively couples to a second external circuit or device 560. Although the circuit block associated with the second power mesh 510 is shown as having only two external circuit connections coupled to external circuits, the circuits formed in the die may be connected to any number of external circuits or devices.

The main power mesh 505 is powered by a connection from a fifth signal pin 544 to a fifth external terminal 524. The main power mesh 505 also couples to a ground source (VSS) by a connection from a sixth signal pin 546 to a sixth external terminal 528.

The semiconductor device 500 illustrates a semiconductor die able to be used in a full functionality or a reduced functionality end use. The reduced functionality version of the semiconductor device 500 utilizes only a subset of possible external circuit connections. The semiconductor device 500 does not utilize the first external circuit connection 556 and a second external circuit connection 554, and therefore the first power mesh 506 does not need to be powered. Further, no external circuits or devices couple to the first external circuit connection 556 and the second external circuit connection 554, thereby reducing the package space required for the device and potentially the overall size of the device overall. Instead only the main power mesh 505 and the second power mesh 510 are powered.

Because the first power mesh 506 and second power mesh are electrically separate, the first power mesh 506 can be disconnected entirely from power such that it draws no leakage current during powering of the second power mesh 510 or the main mesh 505. Further, because the first power mesh 506 does not rely on internal switches to turn off power flow to the mesh, no additional silicon area is required. This provides an improvement over semiconductor dies in which power to a segment is disconnected by an internal switch.

The electrically separate first power mesh 506 and second power mesh also improves upon solutions using externally switched-off power on the package to the unused circuitry, in that fewer package balls or bonded out connections are required, resulting in a smaller overall package size. All required power connections from the power meshes are made directly on the package, enabling the meshes to share the ground or power balls which are already present in the package design.

Figure 6:
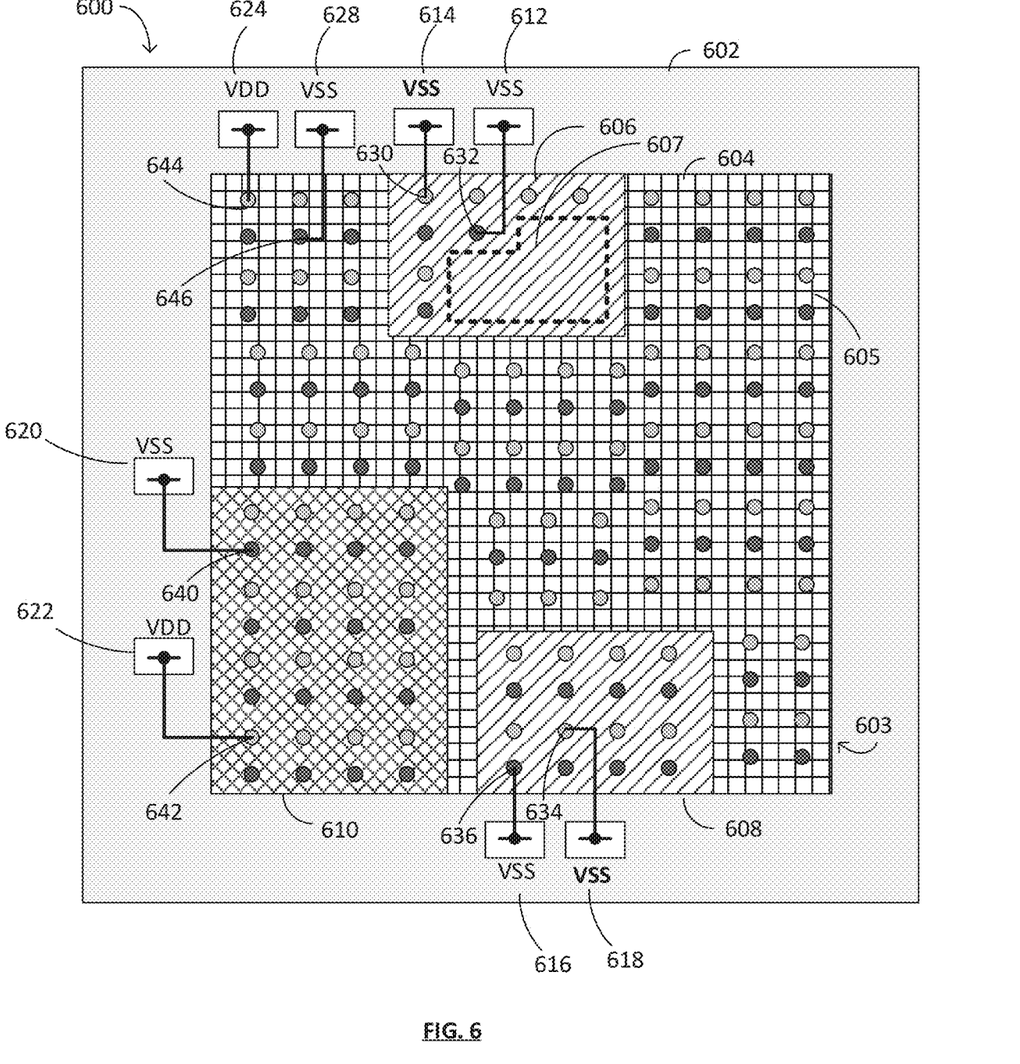
FIG. 6 is a block diagram of a flip chip semiconductor device having a plurality of package balls removed.

FIG. 6 is a block diagram of a semiconductor device having a plurality of package balls removed. The semiconductor device 600 includes a package 602 and a semiconductor die 604 formed on a base substrate 603, the semiconductor die 604 having a main power mesh 605, a first power mesh 606, a second power mesh 608, and a third power mesh 610. The semiconductor device 600 includes a plurality of package balls for connecting to external power and ground sources.

The package 602 includes a plurality of external terminals which are designed to be communicatively coupled to receive an external signal. The first power mesh 606 couples to a ground source (VSS) by a connection from a first package ball 630 to a first external terminal 614 and a connection from a second package ball 632 to a second external terminal 612. The first power mesh 606 does not couple to an external terminal providing power. Although only the first package ball 630 and the second package ball 632 are depicted as coupled to an external terminal, any number of package balls in the power meshes can be coupled to external terminals. Additional package balls are illustrated across the semiconductor die 600 as grey and black dots, though not all are shown as being coupled to a power or ground source.

The second power mesh 608 couples to a ground source (VSS) by a connection from a third package ball 634 to a third external terminal 618 and by a connection from a fourth package ball 636 to a fourth external terminal 616. The second power mesh 608 does not couple to an external terminal providing a power source.

The third power mesh 610 is powered by a connection from a fifth package ball 642 to a fifth external terminal 622. The third power mesh 610 also couples to a ground source (VSS) by a connection from a sixth package ball 640 to a sixth external terminal 620. The main power mesh 605 is powered by a connection from a seventh package ball 644 to a seventh external terminal 624. The main power mesh 605 couples to a ground source (VSS) by a connection from an eighth package ball 646 to an eighth external terminal 628.

The first power mesh 606 and the second power mesh 608 of the semiconductor device 600 are not powered and thus the associated circuitry will be non-operational. Because all package balls in the first power mesh 606 connect to ground and no package balls connect to power, a subset of the package balls in the semiconductor die 604 may be removed to make room for additional signal routing. The area 607 on the semiconductor die 604 in the first power mesh 606 has a plurality of connecting package balls removed. In such a case, the vias for the removed package balls are also removed.

The removal of unnecessary package balls in power meshes which are not powered provides additional room for signal routing beneath the semiconductor die 604 rather than on the sides of the package 603 where there is often insufficient area. By designing the power mesh and the substrate to ensure that segmented power supplies are connected to the appropriate ground or power supplies on the package 603 and removing unnecessary package balls in areas of non-operational circuitry, space can be conserved for routing of signals beneath unused power meshes without drilling additional vias.

The removal of package balls, or "ball-out," must take into account the mechanical strength of the remaining package balls to withstand normal thermal and mechanical stresses that the package undergoes during operation. Because the package balls in the area of the first power mesh 606 (and the second power mesh 608) connect to ground signals only and the package balls in these regions receive no power, keeping the associated circuit blocks turned off requires only a small number of package balls.

The package balls can be removed later in the manufacturing cycle without any need to change the design of the semiconductor die. This adds to the flexibility of the package design and enables additional area for signal connectivity in regions of unused circuitry without the need for additional vias.

Figure 7:
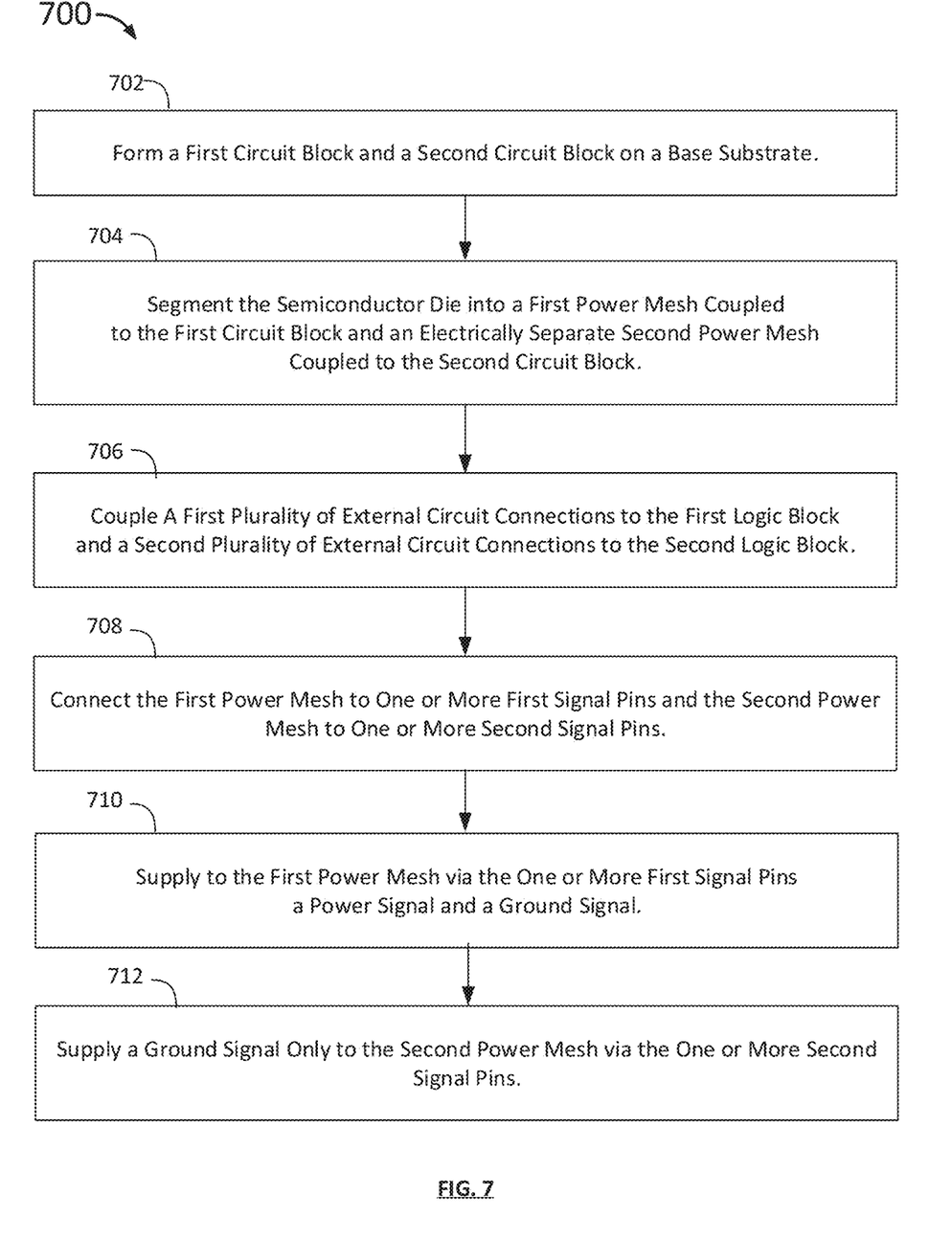
FIG. 7 is a flow chart that illustrates a method for producing a semiconductor die having segmented power meshes.

FIG. 7 is a flow chart that illustrates a method for producing a semiconductor device having segmented power meshes. The process begins with step 702, at which a first circuit block and a second circuit block are formed from a portion of the circuitry of the semiconductor die on a substrate. The circuit blocks may serve the same or different functions. In some implementations, more than two circuit blocks are formed from the circuitry of the semiconductor die.

At step 704, the semiconductor die is segmented into a first power mesh which couples to the first circuit block, and a second power mesh which couples to the second circuit block. The first power mesh and the second power mesh are associated with the first circuit block and the second circuit block, respectively. The first power mesh and the second power mesh are electrically separate from one another. In some implementations, additional power meshes are formed on the semiconductor die.

At step 706, a first plurality of external circuit connections is communicatively coupled to the first circuit block, and a second plurality of external circuit connections is communicatively coupled to the second circuit block.

At step 708, the first power mesh is connected to one or more first signal pins, and the second power mesh is connected to one or more second signal pins. The signal pins are configured to be coupled to external terminals to provide power or ground to the first and second power meshes. The external terminals may provide various external signals, including one of power or ground signals which are supplied to the power meshes by the one or more first and second signal pins. The first power mesh and second power mesh couple to the one or more external terminals by the one or more first signal pins and the one or more second signal pins, respectively.

At step 710, the one or more first signal pins supplies the first power mesh with a power signal and a ground signal from an external terminal. The first power mesh is powered, enabling the associated first circuit block to be turned on and to function, for example to communicate with an external circuit or device through the first plurality of circuits.

At step 712, the one or more second signal pins supplies the second power mesh with a ground signal only. The second power mesh is not powered, and the associated second circuit block is non-operational. No signals are sent over the second plurality of external circuit connections. Because it is not powered and is not connected to an external terminal supplying power by any signal pins, the second power mesh does not draw any leakage current when the first power mesh is powered, and the first power mesh exists in the lowest power state.

In some implementations, a plurality of package balls are removed from the area of the second power mesh to make additional space for signal connections on the package. Because the second power mesh is not powered and does not connect to a power source, not all of the package balls are required to support the package.

By segmenting the semiconductor die into electrically separate power meshes, associated circuitry can be turned fully off so as to be non-operational in certain versions of a device, while other versions made with the same semiconductor die can have full functionality of all existing circuits on the semiconductor die. The separate power meshes allow circuit blocks to be selectively turned off or on for a device version so that non-operational circuitry draws no power.

Other objects, advantages and embodiments of the various aspects of the present invention will be apparent to those who are skilled in the field of the invention and are within the scope of the description and the accompanying Figures. For example, but without limitation, structural or functional elements might be rearranged consistent with the present invention. Similarly, principles according to the present invention could be applied to other examples, which, even if not specifically described here in detail, would nevertheless be within the scope of the present invention.

What is claimed is:

1. A semiconductor chip comprising a semiconductor die formed on a substrate, the semiconductor die comprising:
   a first power mesh formed on the substrate;
   a second power mesh formed on the substrate and configured to be electrically isolated from the first power mesh;
   a first circuit block formed on the substrate and electrically connected to the first power mesh configured to supply power to the first circuit block;
   a second circuit block formed on the substrate and electrically connected to the second power mesh configured to supply power to the second circuit block;
   a first plurality of external circuit connections communicatively coupled to the first circuit block and communicatively isolated from the second circuit block;
   a second plurality of external circuit connections communicatively coupled to the second circuit block and communicatively isolated from the first circuit block;
   one or more first signal pins formed on the substrate configured to be communicatively coupled to receive first one or more signals external to the semiconductor chip; and
   one or more second signal pins formed on the substrate configured to be communicatively coupled to receive second one or more signals external to the semiconductor chip;
   wherein the first power mesh is formed over the first circuit block, and the second power mesh is formed over the second circuit block.

2. The semiconductor chip of claim 1, wherein the second circuit block is configured to be non-operational.

3. The semiconductor chip of claim 2, wherein the first circuit block is coupled to at least one of the one or more first signal pins and at least one of the one or more second signal pins.

4. The semiconductor chip of claim 3, wherein the second circuit block is coupled to at least one of the one or more second signal pins and is not coupled to any of the one or more first signal pins.

5. The semiconductor chip of claim 4, wherein the one or more first signal pins are configured to receive power from a power supply and the one or more second signal pins are configured to receive a ground supply.

6. The semiconductor chip of claim 5, wherein the second power mesh does not receive power from the power supply.

7. The semiconductor chip of claim 4, wherein the first power mesh is segmented by providing a first layer of connections configured to connect to a ground supply and a second layer of connections configured to connect to a power supply, and the second power mesh is segmented by providing a third layer of connections configured to connect to the ground supply and a fourth layer of connections configured to connection to the power supply.

8. The semiconductor chip of claim 7, wherein signal pins connected to the third layer and the fourth layer are not coupled to the power supply.

9. The semiconductor of claim 8, wherein the signal pins connected to the third layer and the fourth layer are coupled to a ground supply.

10. The semiconductor chip of claim 1, wherein a flow of current through the first circuit block does not induce a leakage current in the second circuit block.

11. The semiconductor chip of claim 1, wherein the first circuit block and second circuit block are instantiated on a ball grid array.

12. The semiconductor chip of claim 11, wherein the second circuit block is connected to a ground supply by a plurality of ball connections.

13. The semiconductor chip of claim 1, further comprising a plurality of external devices coupled to the first plurality of external circuit connections.

14. The semiconductor chip of claim 1, wherein the first plurality of external circuit connections are physically isolated from the second circuit block and the second plurality of external circuit connections are physically isolated from the first circuit block.

* * * * *